(12) United States Patent
Mathews

(10) Patent No.: US 6,465,326 B2
(45) Date of Patent: *Oct. 15, 2002

(54) METHODS OF FORMING FIELD OXIDE AND ACTIVE AREA REGIONS ON A SEMICONDUCTOR SUBSTRATE

(75) Inventor: Viju K. Mathews, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/855,593

(22) Filed: May 14, 2001

(65) Prior Publication Data

US 2001/0029085 A1 Oct. 11, 2001

Related U.S. Application Data

(63) Continuation of application No. 09/287,089, filed on Apr. 6, 1999, now Pat. No. 6,245,644, which is a continuation of application No. 08/807,296, filed on Feb. 27, 1997, now Pat. No. 5,930,647.

(51) Int. Cl.⁷ .......................................... H01L 21/762
(52) U.S. Cl. ....................................................... 438/452
(58) Field of Search ........................ 438/452, FOR 229

(56) References Cited

U.S. PATENT DOCUMENTS

| 4,219,379 A | 8/1980 | Athanas |
| 4,407,696 A | 10/1983 | Han et al. |
| 4,539,744 A | 9/1985 | Burton |
| 4,679,304 A | 7/1987 | Bois |
| 4,952,525 A | 8/1990 | van der Plas |
| 5,175,123 A | 12/1992 | Vasquez et al. |
| 5,432,117 A | 7/1995 | Yamamoto |
| 5,567,645 A | * 10/1996 | Ahn et al. |
| 5,728,622 A | * 3/1998 | Yu |
| 5,858,860 A | * 1/1999 | Shim et al. |
| 5,972,775 A | * 10/1999 | Chen |

* cited by examiner

Primary Examiner—George Fourson
(74) Attorney, Agent, or Firm—Wells St. John P.S.

(57) ABSTRACT

Methods of forming a field oxide region and an adjacent active area region are described. A semiconductive substrate is masked with an oxidation mask while an adjacent area of the substrate remains unmasked. The substrate is exposed to conditions effective to form a field oxide region in the adjacent area. The field oxide region has a bird's beak region which extends toward the active area. A mass of material is formed over at least a portion of the bird's beak region. In a preferred implementation, the mass of material is formed from material which is different than the material from which the oxidation mask and the field oxide region are formed. According to one aspect of the invention, the material comprises, polysilicon. In another preferred implementation, such different material comprises a spacer which is formed over at least a portion of the oxidation mask. Preferably, an undercut region is formed under the mass or spacer and subsequently filled with oxide material. During the filling of the undercut region, at least some of the mass or spacer is oxidized to form a bump over the bird's beak region. Oxide material is then removed from over the active area with such removal reducing the size of the bump. A gate dielectric layer can then be provided over the active area.

11 Claims, 7 Drawing Sheets

METHODS OF FORMING FIELD OXIDE AND ACTIVE AREA REGIONS ON A SEMICONDUCTOR SUBSTRATE

RELATED PATENT DATA

This patent resulted from a continuation application of U.S. patent application Ser. No. 09/287,089, filed on Apr. 6, 1999, now U.S. Pat. No. 6,245,644, which is a continuation of U.S. patent application Ser. No. 08/807,296, filed Feb. 27, 1997 now U.S. Pat. No. 5,930,647.

TECHNICAL FIELD

This invention relates to methods of forming field oxide and adjacent active area regions on a semiconductive substrate.

BACKGROUND OF THE INVENTION

Integrated circuits are typically fabricated over a semiconductive substrate and can include many individual transistor or device constructions. Implementing electrical circuits involves connecting isolated devices through specific electrical paths. It must, therefore, be possible to isolate respective transistor or device constructions. A variety of techniques have been developed to isolate devices in integrated circuits. One technique, termed LOCOS isolation (for LOCal Oxidation of Silicon) involves the formation of a semi-recessed oxide in the nonactive (or field) areas of the substrate. Prior art LOCOS isolation is discussed briefly in this section as such pertains to the present invention. For a more detailed discussion of LOCOS isolation, the reader is directed to a text by Wolf entitled, "Silicon Processing for the VLSI Era", Vol. 2, Chapter 2, the disclosure of which is hereby incorporated by reference.

Figure 1:
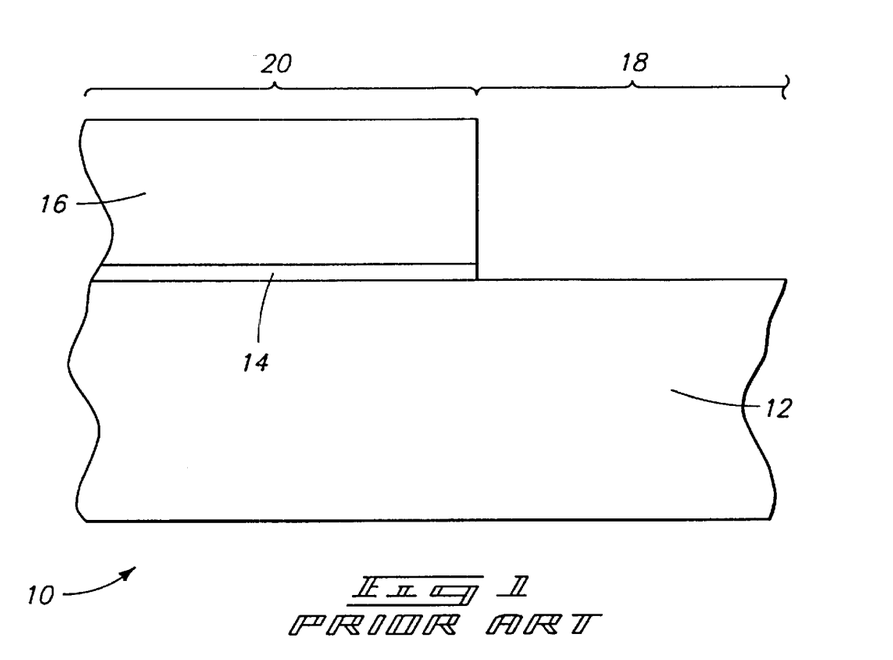
FIG. 1 is a diagrammatic sectional view of a semiconductor wafer fragment at one prior art processing step and is discussed in the "Background of the Invention" section above.

Referring to FIG. 1, a prior art semiconductor wafer fragment in process is indicated generally by reference numeral 10. Such comprises a semiconductive substrate 12 over which a field oxide or isolation oxide region is to be formed by LOCOS techniques. In the context of this document, the term "semiconductive substrate" is defined to mean any construction comprising semiconductive material, including, but not limited to bulk semiconductive material such as semiconductive wafer (either alone or in assemblies comprising other materials thereon) and semiconductive material layers (either alone or in assemblies comprising other materials). The term "substrate" refers to any supporting structure, including, but not limited to, the semiconductive substrates described above. A pad oxide layer 14 is formed over substrate 12 and an oxidation mask 16, comprised of a suitable material such as silicon nitride, is formed over pad oxide layer 14. Portions of layers 14, 16 (not shown) have been removed to expose a substrate portion 18. Portion 18 constitutes a portion of the substrate in which a LOCOS isolation structure or isolation oxide region is to be formed. Adjacent substrate portion 18, a masked substrate portion 20 remains. Portion 20 constitutes at least a portion of the substrate which is to support at least one integrated circuit construction. Accordingly, such portion constitutes an active area.

Figure 2:
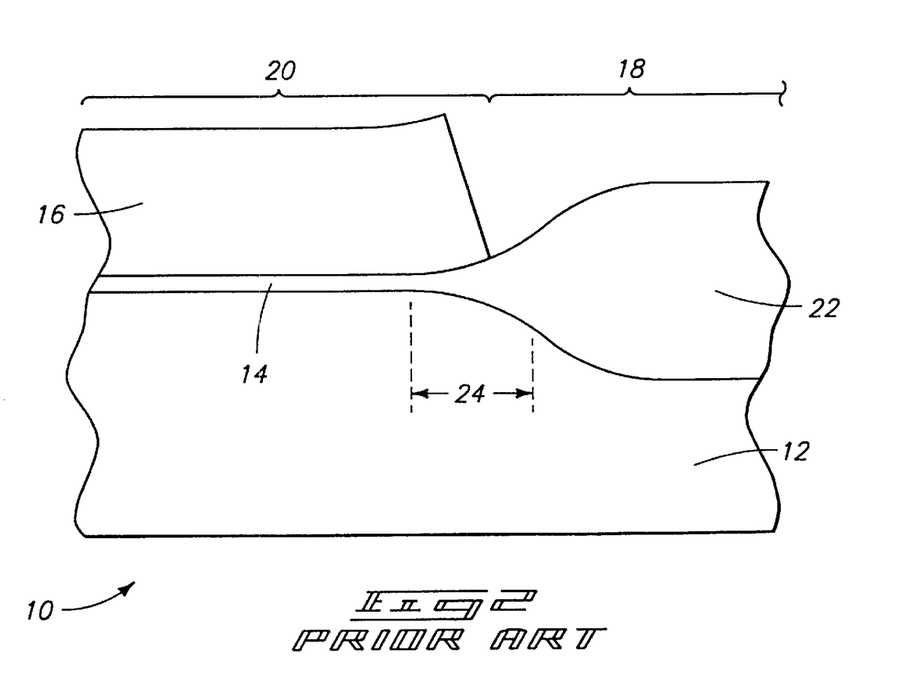
FIG. 2 is a view of the FIG. 1 wafer fragment at a prior art processing step subsequent to that shown by FIG. 1.

Referring to FIG. 2, substrate 12 is exposed to oxidation conditions which are sufficient to form oxide isolation region or field oxide region 22 within portion 18. Accordingly, as is known, the formation of region 22 typically causes a bird's beak region 24 to be formed, a portion of which extends under and upwardly lifts oxidation mask 16.

Figure 3:
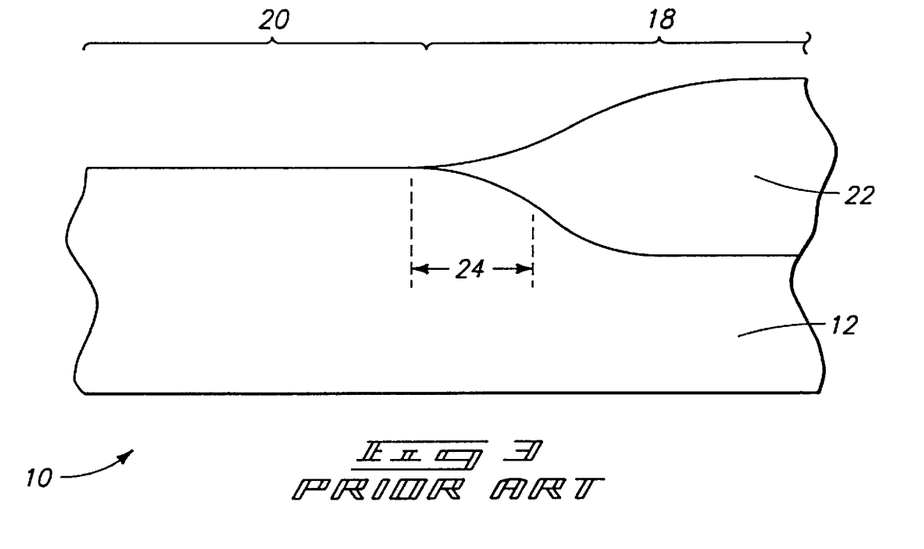
FIG. 3 is a view of the FIG. 1 wafer fragment at a prior art processing step subsequent to that shown by FIG. 2.

Referring to FIG. 3, oxidation mask 16 and pad oxide layer 14 are suitably removed or etched. Such defines a more pronounced bird's beak in region 24.

Figure 4:
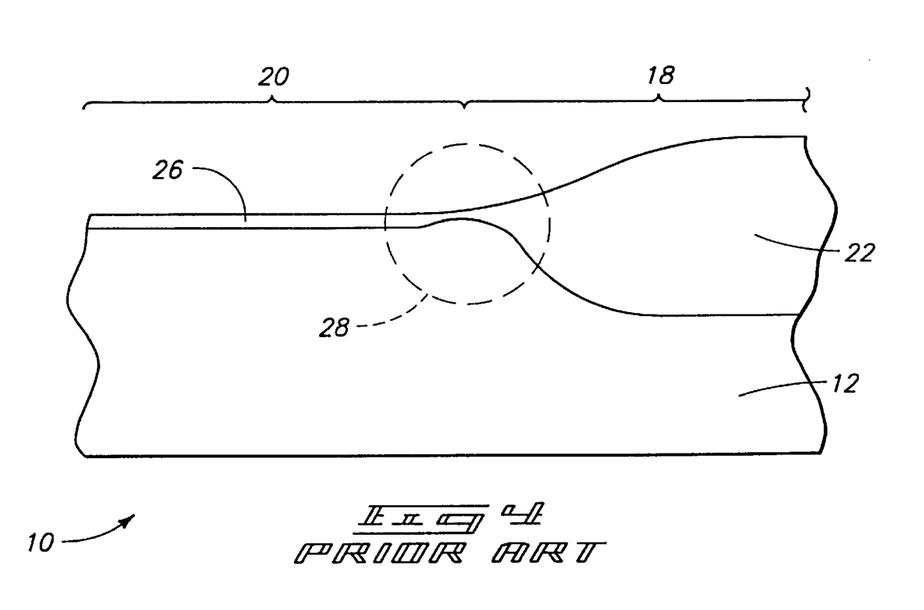
FIG. 4 is a view of the FIG. 1 wafer fragment at a prior art processing step subsequent to that shown by FIG. 3.

Referring to FIG. 4, a sacrificial oxide layer 26 is formed over substrate 12 typically to overcome a phenomena known as the Kooi effect. During the growth of field oxide, the Kooi effect can cause later defects when a gate oxide is formed. More specifically, during field oxide growth, a thin layer of silicon nitride can form on the silicon surface and close to the border of the active regions as a result of the reaction between the oxidizing species, oxygen and water, and the silicon nitride. In particular, $NH_3$ is generated from the reaction. between the water and the masking nitride during the field oxidation step. This $NH_3$ then diffuses through the oxide and reacts with the silicon substrate to form silicon-nitride ribbons. When the nitride mask and pad oxide are removed, there is a possibility that the silicon-nitride ribbon remains present. When gate oxide is subsequently grown, the growth rate becomes impeded at the locations where such silicon-nitride ribbons remain. The gate oxide is thus thinner at these locations than elsewhere giving rise to problems associated to low voltage breakdown of the gate oxide. The most widely used method of eliminating the silicon-nitride ribbon problem is to grow a sacrificial oxide layer, typically about 25 to about 50 nanometers thick, after stripping the masking nitride and pad oxide. This sacrificial oxide layer is then removed by wet etching before growing the final gate oxide.

It has been found that the removal of the prior formed pad oxide layer 14 (FIG. 2) together with the formation and removal of the sacrificial oxide layer 26 can lead to a slightly thinner region 28 adjacent oxide isolation region 22 when the gate oxide layer is ultimately formed.

Figure 5:
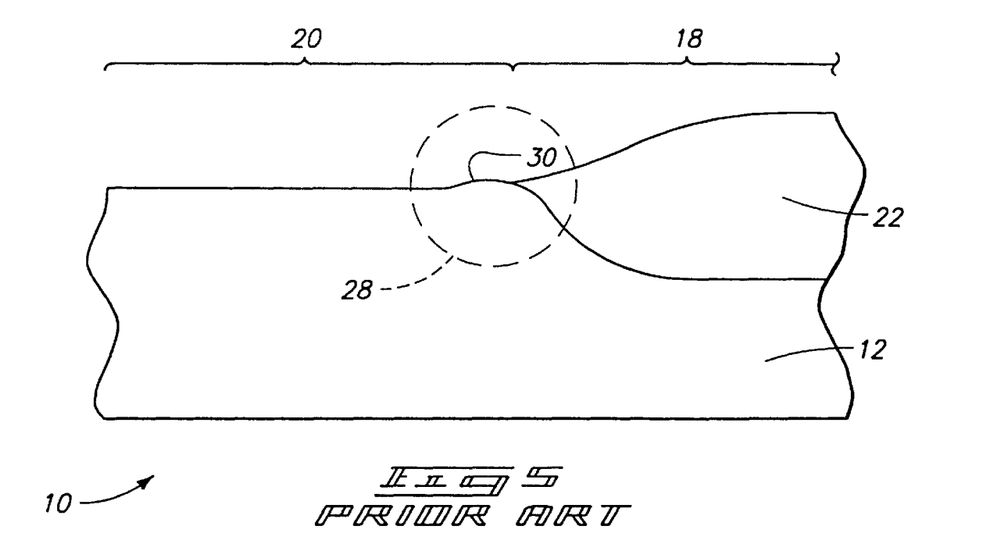
FIG. 5 is a view of the FIG. 1 wafer fragment at a prior art processing step subsequent to that shown by FIG. 4.

Referring to FIG. 5, and prior to formation of a gate oxide layer, sacrificial oxide layer 26 is suitably removed. In the illustrated example, such can cause field oxide region 22 to be recessed to a degree which results in the formation of a convex bump 30 laterally adjacent oxide isolation region 22.

Figure 6:
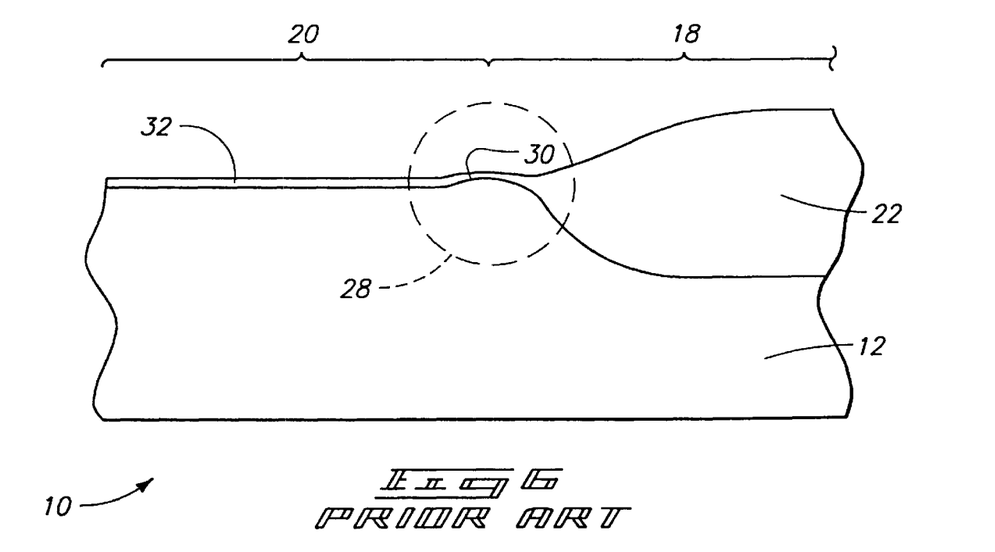
FIG. 6 is a view of the FIG. 1 wafer fragment at a prior art processing step subsequent to that shown by FIG. 5.

Referring to FIG. 6, a gate oxide layer 32 is formed over substrate 12. Oxidation of bump 30 results in localized thinning of the gate oxide within region 28. Such thinning can lead to device failure brought on by gate shorting.

This invention arose out of concerns associated with improving the processing of semiconductor devices. This invention also arose out of concerns associated with improving the uniformity with which semiconductor devices can be formed.

SUMMARY OF THE INVENTION

Methods of forming a field oxide region and an adjacent active area region are described. A semiconductive substrate is masked with an oxidation mask while an adjacent area of the substrate remains unmasked. The substrate is exposed to conditions effective to form a field oxide region in the adjacent area. The field oxide region has a bird's beak region which extends toward the active area. A mass of material is formed over at least a portion of the bird's beak region. In a preferred implementation, the mass of material is formed from material which is different than the material from which the oxidation mask and the field oxide region are formed. According to one aspect of the invention the material comprises polysilicon. In another preferred implementation, such different material comprises a spacer which is formed over at least a portion of the oxidation mask. Preferably, an undercut region is formed under the mass or spacer and subsequently filled with oxide material.

During the filling of the undercut region, at least some of the mass or spacer is oxidized to form a bump over the bird's beak region. Oxide material is then removed from over the active area with such removal reducing the size of the bump. A gate dielectric layer can then be provided over the active area.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Like numbers from the above-described embodiment are utilized where appropriate, with differences being indicated with the suffix "a" or with different numerals. Processing of the below-described semiconductor wafer fragment takes place in accordance with the above described methodology up to and including that which is shown in FIG. 2. It is at this point that the novel departure begins.

Figure 7:
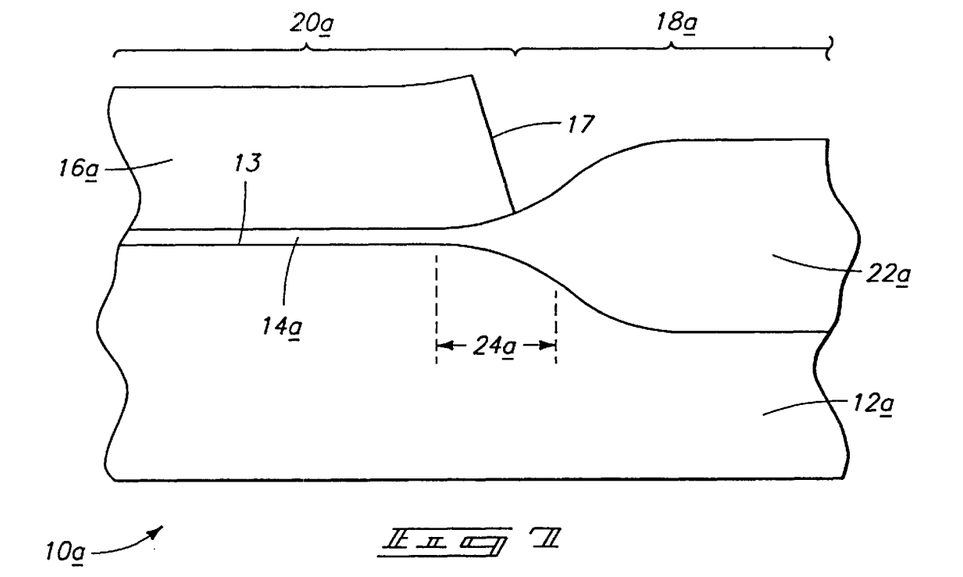
FIG. 7 is a view of a semiconductor wafer fragment at a processing step which corresponds to the FIG. 2 processing step.

Referring to FIG. 7, a semiconductor wafer fragment 10a is shown at a processing step following that which is shown in FIG. 1. Accordingly, a pad oxide layer 14a and an oxidation mask or masking layer 16a, preferably comprising nitride, have been suitably formed and subsequently etched, as in FIG. 1, to define thereunder a substrate active area portion 20a. A laterally adjacent area 18a is unmasked with any masking layer material which enables a field oxide or isolation oxide region 22a to be formed as described above. As shown, masking layer 16a includes a sidewall 17 adjacent unmasked substrate area 18a.

Substrate 12a is subjected or exposed to oxidizing conditions which are effective to form the oxide isolation region 22a in area 18a adjacent masking layer 16a and masking layer sidewall 17. Oxide isolation region 22a includes a bird's beak region 24a which extends toward masking layer sidewall 17 and joins with active area portion 20a.

Figure 8:
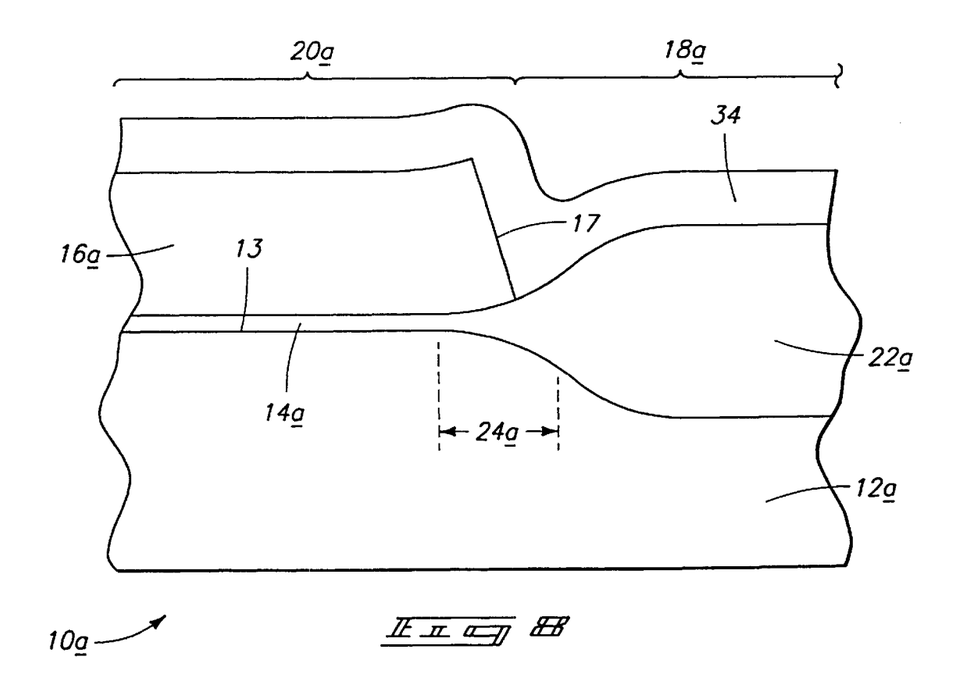
FIG. 8 is a view of the FIG. 7 wafer fragment at a subsequent processing step in accordance with the invention.

Referring to FIG. 8, a layer 34 is formed over masking layer 16a and oxide isolation region 22a. Preferably, layer 34 comprises a material which is different from either of the materials from which oxidation mask 16a or field oxide region 22a are formed. In the illustrated example, layer 34 constitutes a non-oxide material as deposited which can be subsequently oxidized. A suitable and preferred material is polysilicon.

Figure 9:
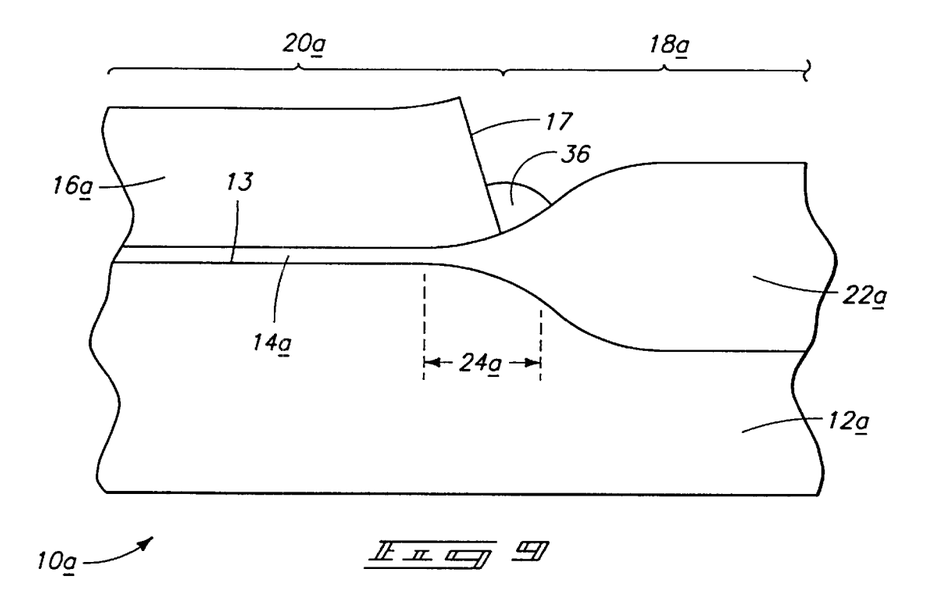
FIG. 9 is a view of the FIG. 8 wafer fragment at a processing step subsequent to that shown by FIG. 8.

Referring to FIG. 9, layer 34 material is selectively removed, as by suitable chemical etching, relative to masking layer 16a and oxide isolation region 22a to leave a mass 36 of oxidizable material over at least a portion of bird's beak region 24a and laterally adjacent oxidation mask sidewall 17. An exemplary dry etch chemistry includes chlorine ($Cl_2$) by itself, or a mixture which includes two or more of the following to improve selectivity to oxide: chlorine ($Cl_2$), hydrogen bromide (HBr), helium (He), and/or oxygen ($O_2$). In the illustrated and preferred embodiment, mass 36 comprises a spacer which is formed over at least a portion of bird's beak region 24a to cover less than all of sidewall 17.

Figure 10:
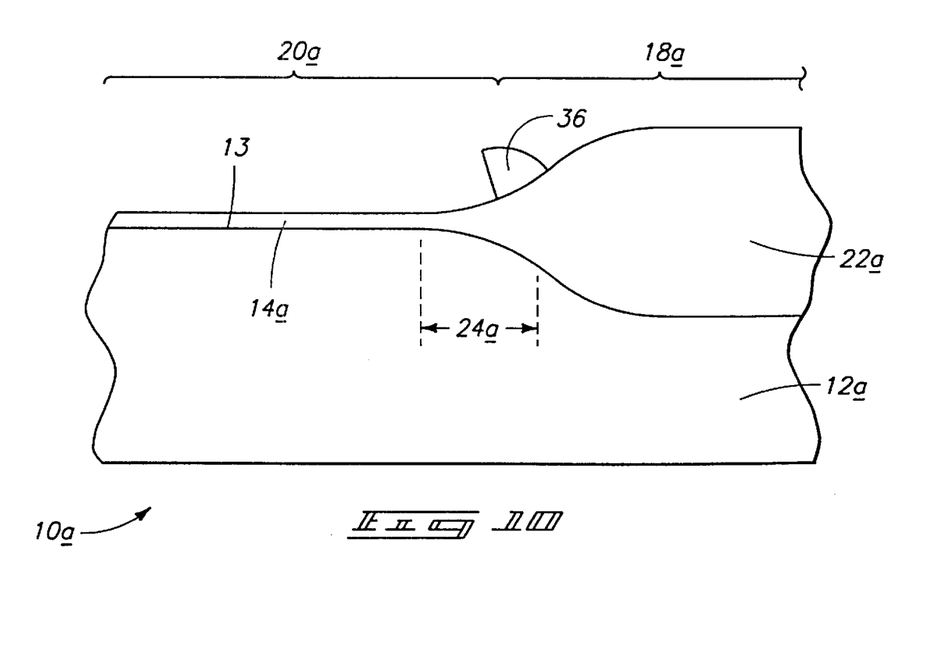
FIG. 10 is a view of the FIG. 8 wafer fragment at a processing step subsequent to that shown by FIG. 9.

Referring to FIG. 10, oxidation mask 16a is removed. In the illustrated example, layer 16a (FIG. 9) is removed by conducting a suitable chemical etch which is substantially selective relative to both the preferred polysilicon material from which spacer 36 is formed and the oxide material from which oxide isolation region 22a is formed. Accordingly, the removing of the masking layer leaves spacer 36 over bird's beak region 24a. An exemplary etch chemistry includes phosphoric acid ($H_3PO_4$).

Figure 11:
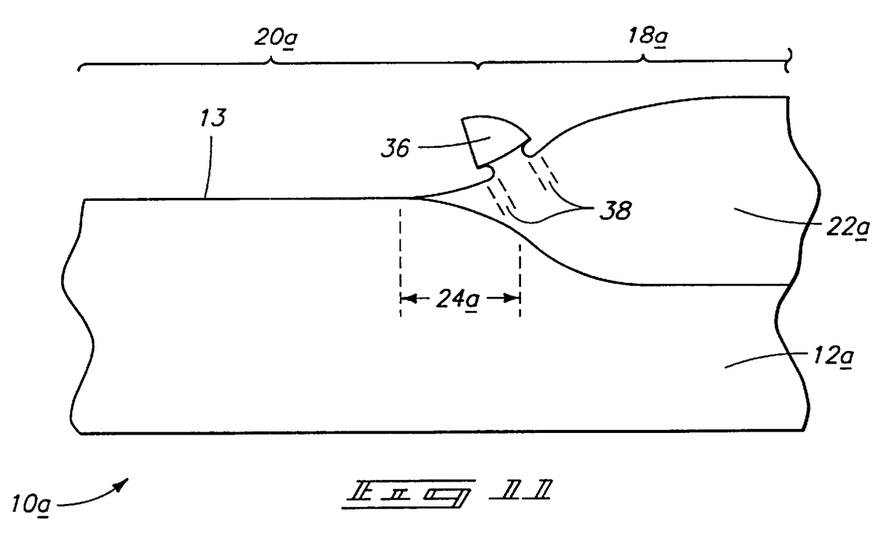
FIG. 11 is a view of the FIG. 8 wafer fragment at a processing step subsequent to that shown by FIG. 10.

Referring to FIG. 11, oxide material is selectively removed relative to spacer 36. Such effectively removes pad oxide layer 14a (FIG. 10). In the illustrated example, a chemical etch of the oxide material is conducted substantially selective relative to the preferred polysilicon material of spacer 36 and to a degree which is sufficient to remove bird's beak region material from under the spacer. An exemplary etch chemistry includes dilute hydrofluoric acid (HF). An. exemplary $H_2O$:HF 10:1 or 100:1 ratio would be suitable. Accordingly, such forms an undercut or undercut region under the spacer which is illustrated as the leftmost undercut region at 38. Such etching also removes oxide material from isolation oxide region 22a to a degree which is sufficient to remove isolation oxide region material from under the spacer. Such forms an undercut or undercut region under the spacer which is the rightmost undercut region designated at 38.

Figure 12:
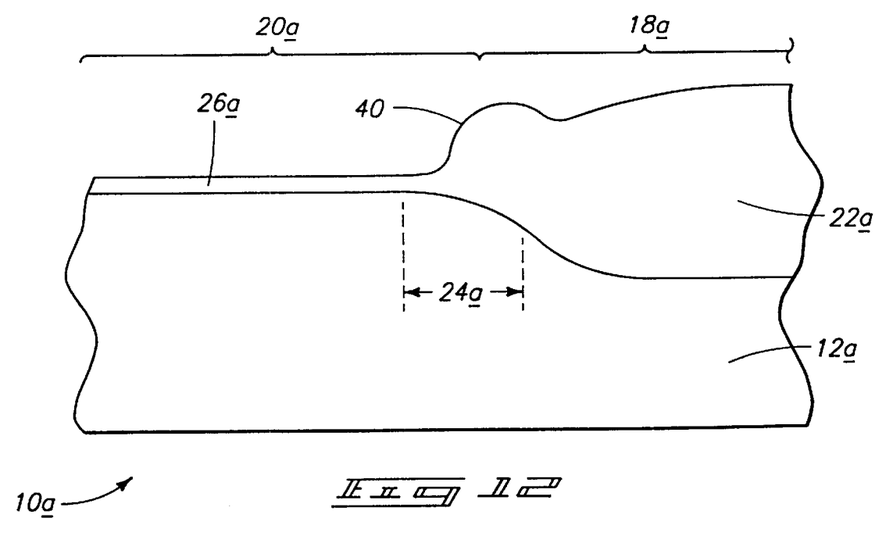
FIG. 12 is a view of the FIG. 8 wafer fragment at a processing step subsequent to that shown by FIG. 11.

Referring to FIG. 12, some, and preferably all of undercut region 38 (FIG. 11) is filled with oxide material. In a preferred implementation, the substrate is exposed to oxidizing conditions which are sufficient to form a sacrificial oxide layer 26a over substrate 12a and to oxidize some, and preferably all of spacer 36 (FIG. 11) to form a bump 40 of oxidized material over bird's beak region 24a. Accordingly, spacer 36 is preferably completely oxidized to form bump 40.

Figure 13:
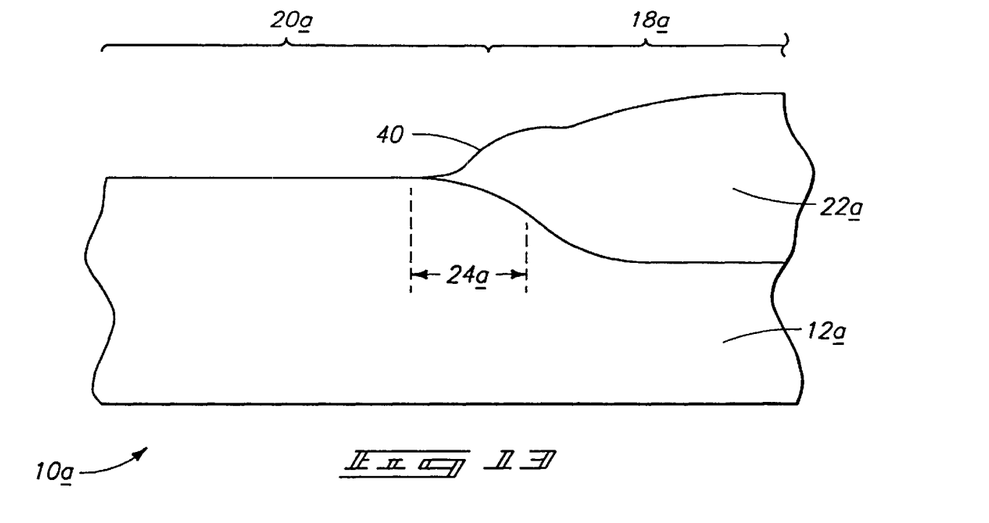
FIG. 13 is a view of the FIG. 8 wafer fragment at a processing step subsequent to that shown by FIG. 12.

Referring to FIG. 13, sacrificial oxide layer 26a is removed to outwardly expose an upper surface of substrate 12a. Preferably, the sacrificial oxide layer is completely removed. In the illustrated example, at least some of bump 40 is removed as well.

Figure 14:
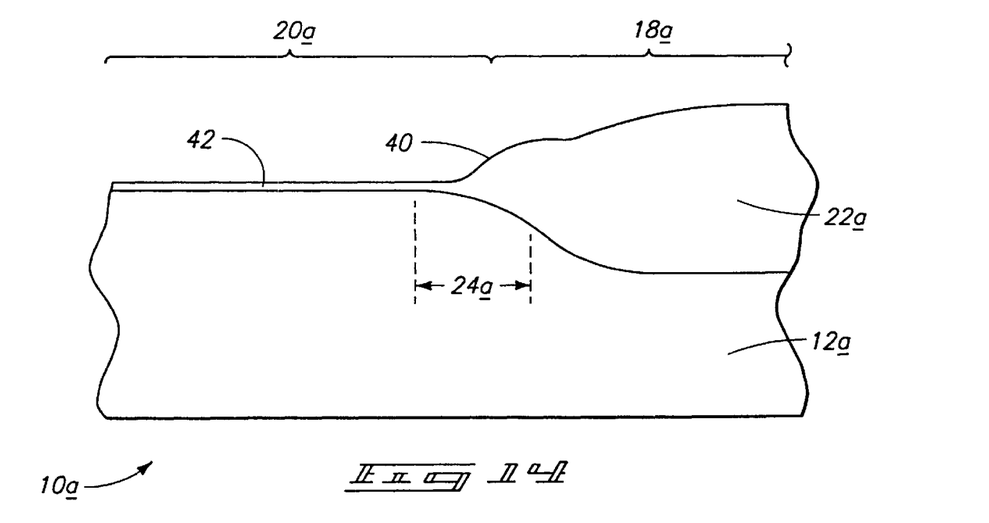
FIG. 14 is a view of the FIG. 8 wafer fragment at a processing step subsequent to that shown by FIG. 13.

Referring to FIG. 14, a gate oxide or dielectric layer 42 is formed over substrate active area 20a.

Comparison of the prior art gate oxide or dielectric layer 32 (FIG. 6) with the improved FIG. 14 gate oxide layer 42 indicates that the latter construction provides a greater degree of uniformity of thickness. In addition, the above described methodology reduces the loss of field oxide at the interface of the active area and field oxide during removal of the pad oxide and sacrificial layers. Correspondingly, concerns associated with device performance relative to a variable or thin gate oxide region, such as region 28 of FIG. 6 are greatly reduced, if not eliminated due to reduction or elimination of bump formation in the active area.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an oxide isolation region and an adjacent active area region comprising:
   providing a semiconductive substrate;
   forming a field oxide region over the semiconductive substrate;
   forming a silicon-containing spacer over the field oxide region;
   undercutting the spacer; and
   after undercutting the spacer, oxidizing at least a portion of the spacer.

2. A method of forming an oxide isolation region and an adjacent active area region comprising:
   providing a semiconductive substrate;
   forming a pad oxide over the substrate;
   forming a patterned oxidation mask over the pad oxide;
   oxidizing the substrate to form a field oxide region beside the patterned oxidation mask;
   forming a silicon-containing spacer over the field oxide region;
   after forming the spacer, removing the patterned oxidation mask and pad oxide;
   undercutting the spacer to form an undercut; and
   filling in the undercut with an oxide material.

3. The method of claim 2 wherein the filling of the undercut comprises forming a sacrificial oxide layer over an active area portion.

4. The method of claim 2 wherein the filling of the undercut comprises exposing the substrate to oxidizing conditions to a degree sufficient to oxidize the at least some of the spacer and to fill the undercut.

5. The method of claim 2 wherein the filling of the undercut comprises exposing the substrate to oxidizing conditions to a degree sufficient to completely oxidize the spacer and to fill the undercut.

6. A method of forming an oxide isolation region on a semiconductive substrate comprising:
   forming an oxide isolation region comprising an oxide material over a semiconductive substrate proximate a semiconductive substrate active area, the oxide isolation region having a bird's beak region extending therefrom;
   forming a mass of silicon-containing material over at least a portion of the bird's beak region and over less than an entirety of the oxide isolation region;
   substantially selectively removing a portion of the oxide material relative to the mass of silicon-containing material; and
   oxidizing at least some of the mass of silicon-containing material to form a bump of oxidized material over the bird's beak region.

7. The method of claim 6 wherein the silicon-containing material is polysilicon.

8. The method of claim 6 wherein the oxidizing comprises completely oxidizing the mass of silicon-containing material.

9. The method of claim 6 further comprising:
   prior to the forming of the oxide isolation region, forming an oxidation mask over the substrate active area, the oxidation mask having a sidewall; and
   wherein the forming of the mass of silicon-containing material comprises:
      forming a layer of silicon-containing material over the substrate; and
      selectively removing some of the silicon-containing material relative to oxidation mask material and to a degree sufficient to leave a sidewall spacer of the silicon-containing material along at least some of the oxidation mask sidewall.

10. The method of claim 9 wherein the oxidation mask comprises nitride.

11. A method of defining an isolation region on a semiconductive substrate comprising:
    forming an oxide isolation region over a semiconductive substrate proximate a semiconductive substrate active area;
    forming a spacer comprising silicon over at least a portion of the isolation region;
    forming an undercut region under the spacer;
    forming a sacrificial oxide layer over the substrate and oxidizing at least a portion of the spacer and filling the undercut region with oxide material;
    removing at least some of the sacrificial oxide layer to outwardly expose the substrate active area; and
    forming a gate oxide layer over the substrate active area.

* * * * *